United States Patent [19]

Pye

[11] 4,046,567

[45] Sept. 6, 1977

[54] CHRISTIANSEN CELLS CONTAINING EPOXY GELLING AGENTS

[75] Inventor: Donald George Pye, Wilmington, Del.

[73] Assignee: E. I. Du Pont de Nemours and Company, Wilmington, Del.

[21] Appl. No.: 710,614

[22] Filed: Aug. 2, 1976

[51] Int. Cl.² .............................................. G03G 5/04
[52] U.S. Cl. ....................................... 96/27 R; 96/67; 96/115 P; 350/312; 350/160 R
[58] Field of Search ....................... 350/160 R, 160 P; 96/35.1, 27 R, 115 P

[56] References Cited

U.S. PATENT DOCUMENTS

| | | | |
|---|---|---|---|
| 3,497,353 | 2/1970 | Steppan | 96/35.1 |
| 3,951,520 | 3/1976 | Warring, Jr. | 350/160 R |

*Primary Examiner*—John D. Welsh

[57] ABSTRACT

A Christiansen cell is provided, which, upon photomodulation, gives a color image having reduced deterioration of color at the edges of the image. The reduced deterioration results by adding a multifunctional epoxy compound and a curing agent for the epoxy compound to the light sensitive medium of a Christiansen cell.

22 Claims, No Drawings

CHRISTIANSEN CELLS CONTAINING EPOXY GELLING AGENTS

BACKGROUND OF THE INVENTION

1. Field of the Invention

This invention relates to Christiansen cells and methods of forming color images having reduced color deterioration obtained with such cells.

2. Prior Art

A. Christiansen Cell Prior Art:

It is well known that, in general, a train of light waves changes direction, i.e., is refracted, when it crosses a boundary separating two media of different indices of refraction and that, except in special cases, only a portion of the incident light passes into the second medium, the remainder being reflected. The directions of propagation of both the reflected and transmitted waves are different from that of the incident wave.

These phenomena are exploited in the Christiansen filter which produces a narrow band pass of color and which has application in the infrared and ultraviolet as well as in the visible region. This filter was first described by C. Christiansen in 1884. The Christiansen filter consists of a finely divided transparent material suspended in an optically homogeneous medium. Constituents are chosen so that they have different but intersecting dispersion curves, i.e., the refractive indices are identical at a particular wave length $\lambda_c$ in or near the visible region, but differ for all other wave lengths. The filter is optically homogeneous for light of wave length $\lambda_c$, i.e., such light is unaffected and passes through the filter without deviation or reflection. However, for all other wavelengths the filter is optically heterogeneous and such light is scattered as a result of the refraction and reflection which occur at the particle-medium interfaces. The degree of scattering for a given wavelength depends on the difference in the two refractive indices at that wavelength so that greater scattering is expected for wavelength farther from $\lambda_c$. Consequently, the transmission curve for the unscatterd light exhibits a maximum at $\lambda_c$.

The only disclosure of the formation of color images by the imagewise modulation of the Christiansen effect is contained in coassigned U.S. Pat. No. 3,951,520, issued Apr. 29, 1976, to Robert K. Waring. A Christiansen cell is formed with a mixture of two immiscible condensed phases having dispersions of refractive index different from each other but with indices of refraction matching at one wavelength in the vicinity of the visible region of the spectrum. The refractive index of one phase (or both) is then locally changed in accordance with a predetermined image so that the matching wavelength changes. Light is passed through the cell and the scattered and unscattered components of the light emerging from the cell are separated and either component is then focused to form a colored image. The use of polymerizable monomers is disclosed as one method of achieving imagewise modulation of the Christiansen effect with the various degrees of polymerization causing corresponding shifts in the dispersion curve of the continuous phase. The sharpness of images formed with such cells is gradually lost due to the combined diffusion of polymer formed and monomer across the image boundaries.

Stabilization of color images formed by photomodulation of the Christiansen effect is described in Applicant's coassigned application Ser. No. 650,800, filed Jan. 20, 1976, now U.S. Pat. No. 4,008,083. The stabilization results by using a photopolymerizable medium containing a polymerizable monomer and a cross-linking monomer in an amount sufficient to produce, upon exposure to actinic light, cross-linked polymer which stabilizes the color image formed and is optically homogeneous with any remaining medium. While the color image formed is essentially maintained over a period of time, there remains a desire to stabilize the color image further so that deterioration of color at the edges of the image is reduced and to form a flexible gel matrix throughout the Christensen cell to stabilize the unexposed material from possible undesirable flow.

Prior art which describes photopolymerization generally is set forth in the aforesaid application Ser. No. 650,800.

B. Epoxy Gelling Agents in Photosensitive Compositions

The use of epoxy compounds in photosensitive, hardenable compositions is described in Japanese Pat. No. 4,728,081, British Pat. No. 1,361,518 and Japanese Pat. No. 7,216,062. These references recognize photohardening characteristics of epxoy systems which contain polymerizable monomers. There is no consideration given to the effect of an epoxy compound on the imaging characteristics of the Christiansen effect or its use in forming a gel matrix to restrict fluid flow.

SUMMARY OF THE INVENTION

According to the present invention there is provided in a Christiansen cell having as its operating element two constituents differing in optical dispersion but having identical refractive indices at a matching wavelength in or near the region of the visible spectrum, the constituents being a disperse phase dispersed in an optically homogeneous light sensitive medium whose refractive index is locally changed upon exposure to actinic light, the improvement wherein the medium contains the reaction product from (1) a multifunctional epoxy-containing compound and (2) a curing agent for the reaction product, said epoxy compound and reaction product being optically homogeneous with the medium.

There is also provided in a method of forming a colored image by projection of light through Christiansen cell so that the light is separated into scattered and unscattered components either of which is focused on a viewing surface, said Christiansen cell having two constituents of different optical dispersion but having identical refractive indices at a matching wavelength in or near the visible spectrum, the constituents being a disperse phase dispersed in an optically homogeneous light sensitive medium whose refractive index is locally changed in accordance with a predetermined image upon exposure to actinic light, the improvement comprising: adding to the medium (1) a multifunctional epoxy-containing compound and (2) a curing agent for the epoxy compound, said epoxy compound and curing agent being optically homogeneous with the medium.

DETAILED DESCRIPTION OF THE INVENTION

The present invention provides for an improved Christiansen cell and method for forming a color image with such a cell by the introduction of two additional ingredients into the operating element of the cell not common to the prior art cells. The first is a multifunctional epoxy-containing compound and the second a curing (hardening) agent for the epoxy compound which will react with the epoxy groups and effect crosslinks to form a gel structure throughout the Christiansen cell. Such a gel structure immobilizes the entire operating element.

The aspects of the present invention relating to the requirements for formation of a Christiansen cell; incorporation of polymerizable monomers, multifunctional crosslinking agents for the monomers or other photosensitive elements; preparation of a disperse phase; actinic light initiators; and exposure and viewing are to be found described in detail in the aforesaid U.S. Pat. No. 3,951,520 and Applicant's application Ser. No. 650,800, the descriptions of which are hereby incorporated by reference. The basic requirements for such cells are that any additives to the continuous medium must be optically homogeneous and that the refractive index of the final medium, achieved by adjusting the concentrations of the various components, must closely match that of a chosen disperse phase so that Christiansen colors will result when the composition is viewed in a suitable projector such as shown in U.S. Pat. No. 3,951,520. In the discussion to follow special details dealing with the use of epoxy compounds will be presented. The term optically homogeneous means that the light sensitive medium both before and after exposure to actinic light will transmit light in or near the visible region without scattering.

The crux of the present invention lies in improving Christiansen color images formed such as described in U.S. Pat. No. 3,951,520 and Ser. No. 650,800 by forming (1) an optically homogeneous light sensitive medium, preferably a photopolymerizable medium, which contains a compatible epoxy resin and curing (hardening) agent for crosslinking the epoxy resin in addition to the usual photosensitive components and inert adjuvants to control refractive index and (2) a disperse phase which has a refractive index suitably matched to that of the light sensitive medium to cause Christiansen colors. The disperse phase is either a solid or a liquid but is preferably a transparent, isotropic solid such as powdered glass or glass spheres. However, other isotropic materials such as powdered NH$_4$Cl can be used.

Media useful in the present invention are preferably photopolymerizable and comprise (1) at least one ethylenically unsaturated monomer, (2) at least one crosslinking monomer for said unsaturated monomer in an amount sufficient to produce cross-linked polymer which is optically homogeneous with the medium and (3) an initiating amount of an actinic light activatable photoinitiator which does not form gaseous or insoluble products. Examples of such materials are described in Ser. No. 650,800. Media activatable by other methods are also useful. Many are described in U.S. Pat. No. 3,951,520. N-vinyl sulfonamides, which are known to undergo photoinitiated rearrangements, are examples of light sensitive materials useful in such media.

A Christiansen cell operating element can be enclosed in a cell or coated on a substrate as a fluid mixture which in a convenient time will gel to form a non-flowable layer. This gelled state offers two significant advantages over liquid operating elements:

1. The photocomposition can be flexed if on a flexible support such as a film base or handled without danger of loss of material due to undesired flow. In fluid systems such as many described in U.S. Pat. No. 3,951,520 and in semisolid, albeit very viscous compositions such as described in Ser. No. 650,800, flow can occur in some circumstances because the materials are not in a gelled state.

2. The image stability of the epoxy-containing operating elements in light sensitive media is improved. Although the stability of the image formed by photopolymerization is vastly improved by the addition of multifunctional monomers as described in Ser. No. 650,800 in that the image is immobilized and remains sharp, some color change at the edges (halo) occurs with time. This effect is thought to be caused by monomer or adjuvants from the unexposed area diffusing into the exposed areas where monomer has been depleted. It is thought that the image structure is sufficiently soft so that it will swell and change refractive index near the edges thus causing the halo effect. When the epoxy gelling agent is present, this halo effect does not occur and images formed not only remain distinct but show no halo effects after months of storage.

An epoxy compound is used in the present invention with the proviso that it is multifunctional so that the reaction product will be a network and that Christiansen imaging requirements such as homogeniety are met. The choice of the epoxy compound will depend largely upon the matching refractive index requirement for the disperse phase. If the index of refraction of the disperse phase is low, aliphatic-based epoxy compounds can be used. In preferred media compositions, the disperse phase has a moderately high refractive index and epoxy compounds based on aromatic structures are more effective.

The epoxy compound need not be a single species and various considerations apparent to those skilled in the art may dictate use of mixtures in various proportions, e.g., under certain conditions it may be desirable to include an amount of an epoxy coupled with a monomeric ethylenic function, e.g., glycidyl methacrylate, so that during photoexposure the polymerizing function can react with a "hook" on the gel network and become anchored. The variety of such combinations in epoxy chemistry make these materials versatile in the practice of this invention. Under other conditions, it may be desirable to include monoepoxy compounds, containing no other functional groups, to act as diluents for the network structure to control its flexibility or compatibility with the rest of the system.

Other factors to be taken into consideration in the selection of the epoxy compound are the number of epoxy groups per molecule and the molecular weight. These factors control both the number of crosslinks per chain and the number required to achieve a gel structure. For example, fewer epoxy crosslinks are required to gel a polymeric material than low molecular weight compounds since the polymer already has extensive chain structure and it can remain in a very loose network if desired. Higher concentrations of reacted epoxy units increase network rigidity. It is to be understood that adaption of these and other aspects of epoxy technology may be used to meet the particular needs of Christiansen imaging.

Examples of epoxy containing compounds that are useful are the diglycidyl ether of bisphenol A (DGEBA), diglycidyl ethers of higher molecular weight resins derived from bisphenol A — both liquid and solid resins — polyglydicyl ethers of various phenol-formaldehyde (novolac) resins, polyglycidyl ethers of various cresol-formaldehyde resins and the like, polyglycidyl ethers of di- and trihydric phenols and polynuclear phenols, diglycidyl phthalate, o-glycidyl phenyl glycidyl ether, triglycidyl p-aminophenol, diglycidyl ether of tetrabromobisphenol A, diglycidyl ether of butanediol, and triglycidyl ether of glycerol. Monomeric epoxy compounds useful in minor proportions with multifunctional materials are exemplified by butyl glycidyl ether, phenyl glycidyl ether and cresyl glycidyl ether. Examples of epoxy compounds containing ethylenically unsaturated polymerizable units are glycidyl acrylate and glycidyl methacrylate. Bisphenol A is 2,2-bis(4-hydroxyphenyl)-propane.

It will be appreciated that other epoxy compounds will also be useful and that the above compounds indicate only the types that can be used. Those skilled in the art may select other compounds or combinations thereof to attain a particular objective of network strength or flexibility providing only that the materials and their ultimate reaction products with "curing agents" as described below fulfill the criteria of optical homogeneity and ultimate refractive index matching with the disperse phase.

Preferred multifunctional epoxy compounds are (1) the epoxy resins based on the diglycidyl ether of bisphenol A and its higher molecular weight polymers, and (2) the epoxy resins based on the polyglycidyl ethers of phenol- or cresol-formaldehyde resins.

The second important adjuvant to the continuous medium is the curing (hardening) agent used to effect the crosslinking of the epoxy material to form the gel network. The type of agent selected will depend on the curing conditions, the length of time desired before the system reaches an intractible state and the nature of other ingredients with which the curing agent must be optically homogeneous. Thus, the agent can be a Lewis base, an amine, an alcohol, a Lewis acid, an anhydride, a mono- or di-carboxylic acid or the like. In general, it has been found that amines are more active at room temperature than anhydrides and if room temperature cure is planned, they are preferred. If it is desired to prepare and coat materials at elevated temperatures, anhydrides may prove more useful since the amine reaction may prove too rapid and gelation may set in before coating is completed. Thus, preparation conditions will play a significant role in determining the type of curing agent chosen. Combinations of curing agents can also be employed and are well known in the art. These combinations must be active, i.e., effective in cross-linking the epoxy resin.

Examples of curing agents that can be used are benzyldimethylamine, triethylamine, diethylethanolamine, N-methylaniline, diethylenetriamine, triethylenetetramine, m-phenylene diamine, polyamides, bisphenol, phenol-formaldehyde (preferably with catalyst), boron trifluoride-monomethylamine, phthalic anhydride, succinic acid, phthalic acid and the like.

Many of the epoxy resins and hardeners are available commercially and it is frequently convenient to purchase pairs of materials from the same source and follow mixing ratios recommended by the manufacturer.

The epoxy resins based on the diglycidyl ether of bisphenol A and its higher molecular weight polymers and those based on the polyglycidyl ethers of the phenol- or cresol- formaldehyde resins have been particularly useful because of their high compatibility with the preferred aromatic constituents of the Christiansen cell and their relatively high refractive indices. The polyamine hardeners, such as triethylenetetramine can be employed at low concentration, are highly compatible and effect the gel reaction at room temperature in a convenient time of several hours. Greater care must be employed with polyamides because they are less compatible and a third phase may be formed, thus, greatly decreasing the quality of the Christiansen image formed.

The relative concentrations of the epoxy material and the hardener depend on the nature of the two materials. For a diglycidyl ether of a bisphenol A resin and a triethylenetetramine hardener a recommended ratio is 13 parts tetramine to 100 parts of resin for maximum hardness. Since the purpose of the use of these materials in a Christiansen cell is to achieve a gel network structure and not necessarily maximum hardness, a maximum reaction is not required and the concentration of hardener can be varied considerably without detriment. It will be appreciated, however, that at low concentrations the time required to reach gelation will be relatively longer than at higher concentrations unless the cure temperature is raised. Although maximum reaction is frequently attained when the stoichiometry between epoxy and hardener moieties is approximately 1:1, a low activity of a hardener unit may dictate a concentration significantly above the stoichiometric level and highly reactive species may effect gelation at low concentration. Useable limits are readily determined for specific epoxy/hardener pairs by those skilled in the art. In general, a hardener concentration is usually in the range of about 0.1 - 200 parts by weight per one hundred parts of epoxy compound. An amine hardener is typically at a concentration of about 1 - 150 parts by weight per one hundred parts of epoxy resin.

The total concentration of epoxy material plus curing agent in the Christiansen photosensitive medium can be varied considerably depending on the degree of rigidity desired. In general, the range can be from about 10 - 70% by weight of the photosensitive medium. However, inasmuch as the epoxy resin is used to form a gel matrix to hold the photosensitive material whose function it is to form the color image, the lower the epoxy concentration the higher will be that of the active constituent. A preferred range, therefore, is from about 15 - 50% by weight of the photosensitive medium.

In the practice of this invention, the various ingredients of the medium are blended before the addition of the disperse phase. It is frequently desirable to blend the epoxy and hardener and effect a partial reaction before these ingredients are added to the rest of the medium to achieve better compatibility. If the photosensitive composition is to be coated on film base, it may be desirable to include a small amount of volatile solvent to reduce the fluid viscosity to a desired level. The total operating element of the cell, including the disperse phase, is then thoroughly degassed and coated with a doctor knife or other suitable instrument. The volatile solvent is evaporated and a protective cover sheet applied, preferably after solvent evaporation, if needed, and after onset of the epoxy gelation reaction. Alternatively, if the operating element is to be placed between slides or an elevated temperature is employed to reduce viscosity, no additional solvent is required.

In general, the epoxide reaction causes a small change in refractive index and thus alters the Christiansen color to some degree. Thus, some allowance for this change is normally made in the initial refractive index matching so that when the reaction is complete, the desired color for unexposed material will be attained. It does not appear necessary to wait for the completion of the epoxy reaction before exposing the material since good results have been obtained under either condition.

SPECIFIC EMBODIMENTS OF THE INVENTION

The following examples will serve to illustrate the specific embodiments of the invention wherein parts and percentages are by weight unless otherwise indicated:

EXAMPLE 1

A liquid mixture was prepared by mixing 5.0 g of a commercial epoxy resin, sold by CIBA Products Company under the same Araldite® 506, and 0.7 g CIBA Araldite® Hardener 951. CIBA literature describes the hardener as triethylenetetramine and the epoxy resin as a liquid resin modified with a reactive diluent. Lee and Neville, Handbook of Epoxy Resins, McGraw-Hill, 1967, p. 4-58, describes the resin as a liquid diglycidyl ether of bisphenol A resin diluted with 11% butyl glycidyl ether. This mixture requires several hours to harden at room temperature.

A 1.0 g. portion of the above mixture was combined with 1.0 g 1-naphthyl methacrylate and 0.1 g of a 10% solution of benzoin methyl ether in 1-chloronaphthalene. The mixture had a refractive index $n_D = 1.577$ as measured on a Zeiss refractometer at room temperature. Part of this liquid mixture was blended with a sufficient amount of a powdered glass of nominal refractive index $n_D = 1.603$ (prepared from an optical grade glass by crushing it, milling it in an agate ball mill and sieving out that portion which would pass a 400 mesh screen) to form a creamy slurry. This material was placed on a glass slide and a cover slide was placed on top to form a photosensitive sandwich. A 1-mil thick peripheral spacer was also placed between the slides to maintain the desired film thickness. The entire sandwich was put in an aluminum slide holder.

When the sandwich was viewed in the projection device described in U.S. Pat. No. 3,951,520, that separates transmitted from scattered light, the transmitted light was blue and the scattered light yellow — typical Christiansen colors. Portions of the photosensitive slide were exposed through a negative for various times to UV light from a 100 watt, high pressure mercury arc. The sharp images formed ranged from light blue to green to brown as a function of the exposure time and after aging for one day they remained unchanged. After two weeks aging, the images remained sharp. The color of the unexposed portion of the cell had shifted more toward the yellow indicating a change of refractive index as the epoxy gelling reaction proceeded.

This example illustrates a photosensitive system employing an epoxy compound as a gelling agent and the use of a mixture of a low molecular weight multifunctional epoxy resin combined with a small amount of monofunctional epoxy diluent. Exposures were made prior to gelation.

EXAMPLE 2

A liquid epoxy mixture was prepared as in Example 1 using 2.5 g CIBA Araldite® 506 and 0.35 g CIBA Araldite® Hardener 951. A 0.75 g portion of this mixture was combined with 0.25 g 1-naphthyl methacrylate and 0.10 g of 10% benzoin methyl ether in 1-chloronaphthalene. Part of this mixture was added to sufficient glass powder of the type used in Example 1 ($n_D = 1.603$) to form a thick paste on a glass slide. The slide was warmed on a hot plate to reduce viscosity and the paste was spread on the slide. Upon cooling, the slurry was very viscous and was covered with a second slide as in Example 1 to form a photosensitive sandwich. The transmitted light as viewed in the projection device was deep blue.

The sandwich was allowed to age for a day to permit the epoxy gelation reaction to occur. Upon re-examination in the viewing apparatus, the color of the transmitted light had shifted slightly to a lighter greenish blue — a result caused by the slight change in refractive index stemming from the epoxy crosslinking reaction. Portions of the photosensitive Christiansen cell were exposed for various times to UV light from a 100 watt, high pressure mercury arc through an appropriate negative. The exposure times, ranging from 3 to 50 min., are dependent on the intensity of the lamp and light flux striking the photosensitive areas. The images viewed in the projector were sharp and had good Christiansen colors ranging from greenish blue to green depending on the degree of exposure.

After 5 days aging the images were still in good condition. Both unexposed and exposed colors had shifted slightly in color, apparently as the epoxy gelation reaction continued. However, after aging for seven more days, no further change had occurred. The unexposed material was a bluish green while the image areas were yellow and sharp.

This result shows that good Christiansen imaging can be achieved in a photosensitive system containing an epoxy resin as a gelling agent to immobilize the structure.

EXAMPLE 3

A mixture was prepared by combining 0.30 g N-ethyl-N-2-propenylbenzene sulfonamide, 0.02 g benzoin methyl ether, 0.60 g of a 75% solution of a commercial epoxy resin, CIBA Novolac EPN 1138, in bromonaphthalene and 0.10 g of a 50% solution of a commercial hardener, Araldite® 951 (see Example 1) in bromonaphthalene. The epoxy is stated to be a polyglycidyl ether of a phenolformaldehyde resin. The mixture had a refractive index $n_D = 1.580$. It was combined with sufficient powdered glass of $n_D = 1.603$, prepared as described in Example 1, to form a thick slurry and this material was spread between glass slides separated by a peripheral plastic film spacer one mil thick. The sandwich was inserted in an aluminum frame and the resulting photosensitive cell was stored at room temperature for several days to harden as the epoxy gelling reaction took place.

The Christiansen colors of the aged cell were a light greenish blue as viewed by transmitted light and yellow orange when the light scattered by the disperse phase was viewed. Exposures varying from 2 to 20 min. to UV light of portions of the cell through negative art work in contact with the cell yielded sharp images ranging from bluish green to yellow (transmitted light) and correspondingly, purple to blue (scattered light) depending on the exposure length and the extent of the reaction.

This example illustrates the use of a second type of photosensitive reaction in epoxy-gelled Christiansen imaging cells.

EXAMPLE 4

As in Example 1, a mixture of 5.0 g CIBA epoxy resin Araldite® 506 and 0.80 g Araldite® Hardener 951 was prepared. 2.0 g of this mixture was blended with 2.0 g 1-naphthyl methacrylate, 0.4 g triethylene glycol dimethacrylate, 0.4 g benzoin methyl ether, 0.2 g 1-chloronaphthalene and 0.2 g of a 5% solution of nitrosocyclohexane in 1-chloronaphthalene. A portion of this clear solution mixture, which had a refractive index $n_D$ = 1.570, was mixed with the powdered glass of Example 1 and the resultant slurry was placed between glass slides separated by one mil peripheral spacers. These photosensitive cells were placed in aluminum slide holders and allowed to cure. One of the slides was cured in an oven at 50° C for about 20 hrs. and then further cured at room temperature. Others were cured at room temperature.

After five days curing, the oven treated and room temperature treated samples both had about the same color when viewed on the projection apparatus — a dark blue — indicating that both samples had cured to nearly the same degree. Separate measurements indicated the material had gelled. Portions of the oven treated sample were exposed to UV light for various times and light intensities and a range of Christiansen colors from light blue to green to yellow as viewed with transmitted light were obtained. The images were sharp and clear. Re-examination after eight days aging showed that the images were still very sharp and clear with virtually no observable color change.

This example shows that the epoxy gelling agent can be used in conjunction with multifunctional image fixing agents and with nitrosocyclohexane additives.

EXAMPLE 5

A formulation consisting of 1.40 g of the epoxy/hardener mixture of Example 4, 2.00 g 1-naphthyl methacrylate, 0.40 g triethylene glycol dimethacrylate, 0.30 g dibutyl phthalate, 0.40 g benzoin methyl ether, 0.05 g 20% nitrosocyclohexane in 1-chloronaphthalene and 0.70 g xylene was prepared. To this mixture was added 6.3 g glass powder of the type used in Example 4 and the material was rotated for 15 min. to disperse the powder. The resulting slurry, which had a creamy consistency, was placed in a vacuum device and occluded air was removed by repeated evacuation. The slurry was then coated on 4-mil Cronar® (Du Pont trade name for its polyethylene terephthalate film base) with a doctor knife set at 10 mils and the photosensitive coating was allowed to age overnight during which time the small amount of xylene coating solvent evaporated and the coating had become lightly gelled. A second piece of the 4-mil film base was then applied with a light roller to improve film contact with the surface and thus minimize the number of trapped air bubbles that would appear during projection viewing as black spots. The cover layer also provided protection for the photosensitive layer against damage.

The coated material was allowed to age for 13 days to permit the epoxy reaction to approach completion. Samples of the flexible, photosensitive material were then exposed as in Example 4 and a series of Christiansen images was obtaind whose color, when viewed in the projector, was dependent on the amount of exposure. The transmitted colors ranged from blue to yellow while the unexposed material was a very dark blue-black. Additional film samples were exposed through various artwork and half-tone negatives for appropriate times and very sharp yellow Christiansen images were formed.

This example illustrates the use of low molecular weight epoxy resins to prepare Christiansen compositions suitable for coating on film base.

EXAMPLE 6

An epoxy mixture was prepared by combining 1.40 g of a 75% CIBA EPN 1138 novolac in 1-bromonaphthalene, 0.30 g xylene and 0.40 g 50% CIBA hardener Araldite® 951 in 1-bromonaphthalene. This mixture was agitated for 45 min. after which 2.50 g of a mixture prepared from 2.20 g 1-naphthyl methacrylate, 0.20 g triethylene glycol dimethacrylate and 0.30 g benzoin methyl ether was added. The clear fluid was mixed for 30 min. and was then combined with 7.5 g of glass powder of nominal refractive index $n_D$ = 1.620. This powder was prepared in the same manner as that used in Example 1. After further stirring to disperse the powder, the mixture was evacuated to remove bubbles and coated on 4-mil Cronar® film base. The coating had gelled lightly after several hours aging. It was overlaid with a top sheet of the film base to protect the surface and allowed to continue curing for several days.

The unexposed flexible composite had a deep blue transmitted color. It was exposed through several types of art work negatives to light from a conventional 275 watt sunlamp for 12 min. at a distance of 8 inches. Very sharp clear images of yellow-orange transmitted Christiansen color were obtained. The art work included lines, letters and half-tones. These images were stored 2½ months at room temperature and again viewed. They were still sharp and readable and in addition showed no halo effects.

This example illustrates the use of a high molecular weight epoxy resin in a composition suitable for coating on film base and the exceptional image stability of the epoxy-gelled coatings of photopolymerizable material.

EXAMPLE 7

The following mixture was prepared. A 0.70 g quantity of CIBA Araldite 7071 (high molecular weight diglycidyl ether of bisphenol (A) was mixed with 1.85 g 1-naphthyl methacrylate, 0.13 g p-xylylene diacrylate, 0.30 g benzoin methyl ether, 0.30 g 1-bromonaphthalene, and 0.30 g pentyl acetate. The mixture was mixed 4 hrs. and the resulting clear solution was blended with 0.35 g of a 67% solution of CIBA Polyamide 825 hardener in 1-chloronaphthalene. The polyamide is described by the manufacturer as a medium molecular weight, high amine content hardener. The mixture was clear after blending. Following dispersion of 5.6 g powdered glass of $n_D$ = 1.620 in the mixture, it was degassed by evacuation and coated on film base as in Example 6 using a 10 mil knife setting. After aging overnight, the lightly gelled coating was covered with a top sheet of film base and allowed to continue to cure for several days.

The unexposed material was bluish black by transmitted light indicating a slightly greater than normal difference in refractive index between the disperse and continuous phases. Exposure through negative materials for various times to UV light as in Example 1 yielded images ranging from bluish green to greenish-yellow.

This example illustrates the use of different epoxy and hardener materials to obtain a gel structure in the Christiansen photoimaging cell.

EXAMPLE 8

A mixture of 5.0 g CIBA Araldite 506 epoxy resin and 1.0 g Araldite® 951 hardener was prepared as in Example 1. To 1.20 g of this mixture was added 0.40 g 2,3-epoxypropyl methacrylate, 2.20 g 1-naphthyl methacrylate, 0.20 g benzoin methyl ether and 0.20 g 1-chloronaphthalene. The material had a refractive index of 1.570. A portion of this mixture was combined with the glass powder of Example 1, $n_D = 1.603$ to give a creamy mixture. A portion was transferred to a glass slide and formed into a Christiansen cell as in Example 1 using a 1-mil peripheral spacer. The slide was placed in an oven at 50° C overnight to accelerate the epoxy gelling reaction. Portions of the Christiansen cell were exposed for various times to UV light through a negative as in Example 1. The resultant images were sharp and had excellent Christiansen colors ranging from light greenish blue through green and yellow to orange. After aging for one day, the images continued to be sharp and to show no deteriorated edge effects.

This example illustrates the use of a monofunctinal epoxy compound combined with a polymerizable monomer compound in conjunction with an epoxy gelling agent and a polymerizable monomer.

What is claimed is:

1. In a Christiansen cell having as its operating element two constituents differing in optical dispersion but having identical refractive indices at a matching wavelength in or near the region of the visible spectrum, the constituents being a disperse phase dispersed in an optically homogeneous light sensitive medium whose refractive index is locally changed upon exposure to actinic light, the improvement wherein the medium contains the reaction product from (1) a multifunctional epoxy-containing compound and (2) a curing agent for the epoxy compound, said reaction product being optically homogeneous with the medium.

2. The Christiansen cell of claim 1 wherein the epoxy compound/curing agent mixture is present in the medium at a concentration of about 10–70 percent by weight of the medium.

3. The Christiansen cell of claim 2 wherein the epoxy compound is an epoxy resin based on (1) a diglycidyl ether of bisphenol A or (2) a polyglycidyl ether of phenol- of cresol-formaldehyde resin.

4. The Christiansen cell of claim 3 wherein the epoxy resin/curing agent mixture concentration is about 15–50 percent by weight of the medium.

5. The Christiansen cell of claim 2 wherein the curing agent is present in the medium at a concentration of about 0.1 – 200 parts by weight of the epoxy compound and is selected from the group consisting of a Lewis base, an amine, an alcohol, an anhydride, an acid, a Lewis acid and active combinations thereof.

6. The Christiansen cell of claim 4 wherein the curing agent is an amine at a concentration of about 1 – 150 parts by weight of the epoxy resin.

7. The Christiansen cell of claim 1 wherein disperse phase is a transparent, isotropic solid and the light sensitive medium is a photopolymerizable medium.

8. The Christiansen cell of claim 7 wherein the transparent, isotropic solid is glass powder and the photopolymerizable medium comprises (1) at least one ethylenically unsaturated monomer, (2) at least one cross-linking monomer for said unsaturated monomer in an amount sufficient to produce cross-linked polymer which is optically homogeneous with the medium and (3) an initiating amount of an actinic light activatable photoinitiator which does not form gaseous or insoluble products.

9. The Christiansen cell of claim 8 wherein the epoxy compound/curing agent mixture is present in the medium at a concentration of about 10–70 percent by weight of the medium and the curing agent is present in the medium at a concentration of about 0.1–200 parts by weight of the epoxy compound and is selected from the group consisting of a Lewis base, an amine, an alcohol, an anhydride, an acid, a Lewis acid and active combinations thereof.

10. The Christiansen cell of claim 9 wherein the epoxy compound is an epoxy resin based on (1) a diglycidyl ether of bisphenol A or (2) a polyglycidyl ether of phenol- or cresol-formaldehyde resin.

11. The Christiansen cell of claim 10 wherein the epoxy resin/curing agent mixture concentration is about 15–50 percent by weight of the medium and the curing agent 12. In a method of forming a colored image by projection of light through a Christiansen cell so that the light is separated into scattered and unscattered components either of which is focused on a viewing surface, said Christiansen cell having two constituents of different optical dispersion but having identical refractive indices at a matching wavelength in or near the visible spectrum, the constituents being a disperse phase dispersed in an optically homogeneous light sensitive medium whose refractive index is locally changed in accordance with a predetermined image upon exposure to actinic light, the improvement comprising: including in the medium an amount effective to gel the medium of the reaction product of (1) a multifunctional epoxy-containing compound and (2) a curing agent for the epoxy compound, said reaction product being optically homogeneous with the medium.

13. The method of claim 12 wherein the epoxy compound/curing agent mixture is included in the medium to give a concentration of about 10–70 percent by weight of the medium.

14. The method of claim 13 wherein the epoxy compound is an epoxy resin based on (1) a diglycidyl ether of bisphenol A or (2) a polyglycidyl ether of phenol- or cresol-formaldehyde.

15. The method of claim 14 wherein the included epoxy resin/curing agent mixture is about 15–50 percent by weight of the medium.

16. The method of claim 13 wherein the curing agent is included to the medium to give a concentration of about 0.1 – 200 parts by weight of the epoxy compound and is selected from the group consisting of a Lewis base, an amine, an alcohol, an anhydride, an acid, a Lewis acid and active combinations thereof.

17. The method of claim 15 wherein the curing agent is an amine included at a concentration of about 1 – 150 parts by weight of the epoxy resin.

18. The method of claim 12 wherein the disperse phase is a transparent isotropic solid and the light sensitive medium is a photopolymerizable medium.

19. The method of claim 18 wherein the transparent, isotropic solid is glass powder and the photopolymerizable medium comprises (1) at least one ethylenically unsaturated monomer, (2) at least one cross-linking monomer for said unsaturated monomer in an amount sufficient to produce cross-linked polymer which is optically homogeneous with the medium and (3) an initiating amount of an actinic light activatable photoinitiator which does not form gaseous or insoluble products.

20. The method of claim 19 wherein the epoxy compound/curing agent mixture is present in the medium at a concentration of about 10–70 percent by weight of the medium and the curing agent is present in the medium at a concentration of about 0.1 – 200 parts by weight of the epoxy compound and is selected from the group consisting of a Lewis base, an amine, an alcohol, an anhydride, an acid, a Lewis acid and active combinations thereof.

21. The method of claim 20 wherein the epoxy compound is an epoxy resin based on (1) a diglycidyl ether of bisphenol A or (2) a polyglycidyl ether of phenol- or cresol-formaldehyde resin.

22. The method of claim 21 wherein the epoxy resin/curing agent mixture concentration is about 15–50 percent by weight of the medium and the curing agent is an amine at a concentration of about 1 – 150 parts by weight of the epoxy resin.

* * * * *